(12) United States Patent
Wang

(10) Patent No.: US 9,274,159 B2
(45) Date of Patent: Mar. 1, 2016

(54) METHOD AND APPARATUS FOR MONITORING AN ELECTRIC POWER CIRCUIT

(71) Applicant: GM GLOBAL TECHNOLOGY OPERATIONS LLC, Detroit, MI (US)

(72) Inventor: Konking (Michael) Wang, Canton, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 281 days.

(21) Appl. No.: 13/943,191

(22) Filed: Jul. 16, 2013

(65) Prior Publication Data

US 2015/0022217 A1  Jan. 22, 2015

(51) Int. Cl.
*G01R 31/02* (2006.01)
*B60L 3/00* (2006.01)
*G01R 31/42* (2006.01)
*G01R 27/18* (2006.01)
*G01R 31/00* (2006.01)

(52) U.S. Cl.
CPC ............... *G01R 31/02* (2013.01); *B60L 3/0069* (2013.01); *G01R 31/025* (2013.01); *G01R 27/18* (2013.01); *G01R 31/006* (2013.01); *G01R 31/42* (2013.01)

(58) Field of Classification Search
CPC .... G01R 31/025; G01R 31/02; B60L 3/0069; B60L 3/04; B60L 33/1803
USPC .......................................... 324/509; 307/10.1
See application file for complete search history.

(56) References Cited

U.S. PATENT DOCUMENTS

| | | | |
|---|---|---|---|
| 6,381,110 B1* | 4/2002 | Nagashima et al. | 361/23 |
| 2005/0231217 A1* | 10/2005 | Carruthers | G01R 27/18 324/691 |
| 2008/0036466 A1* | 2/2008 | Raber | 324/509 |
| 2009/0091868 A1* | 4/2009 | Trenchs et al. | 361/42 |
| 2010/0175619 A1* | 7/2010 | Albanese et al. | 118/503 |
| 2010/0244760 A1* | 9/2010 | Anwar et al. | 318/490 |
| 2011/0218746 A1* | 9/2011 | Joo | 702/62 |
| 2012/0212172 A1* | 8/2012 | Valdez et al. | 318/805 |
| 2013/0300430 A1* | 11/2013 | Lindsay et al. | 324/522 |

* cited by examiner

*Primary Examiner* — Jeff Natalini

(57) ABSTRACT

A method for monitoring an electric power circuit configured to transfer a power signal to a torque module that is electrically isolated from a chassis ground includes injecting a common voltage component into a common mode voltage of electrical phases during operation and monitoring a negative-ground voltage and a positive-negative voltage of the electric power circuit. An AC line resistance is determined based upon the negative-ground voltage and the positive-negative voltage. Faults in electrical isolation between the electric power circuit and a chassis ground are detected based upon the AC line resistance.

16 Claims, 3 Drawing Sheets

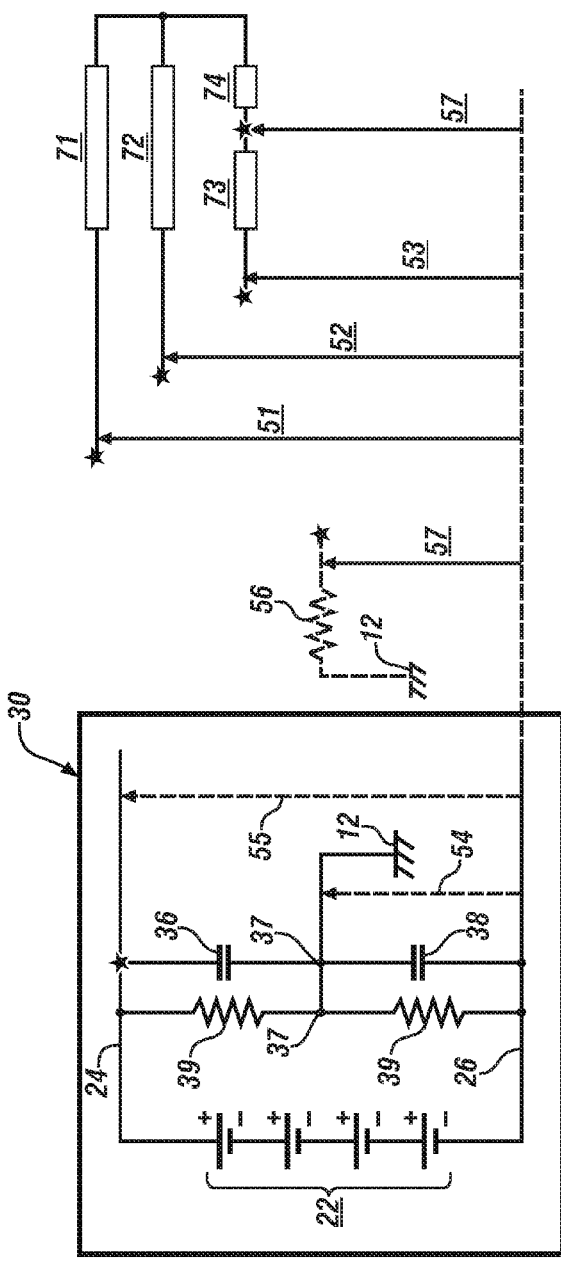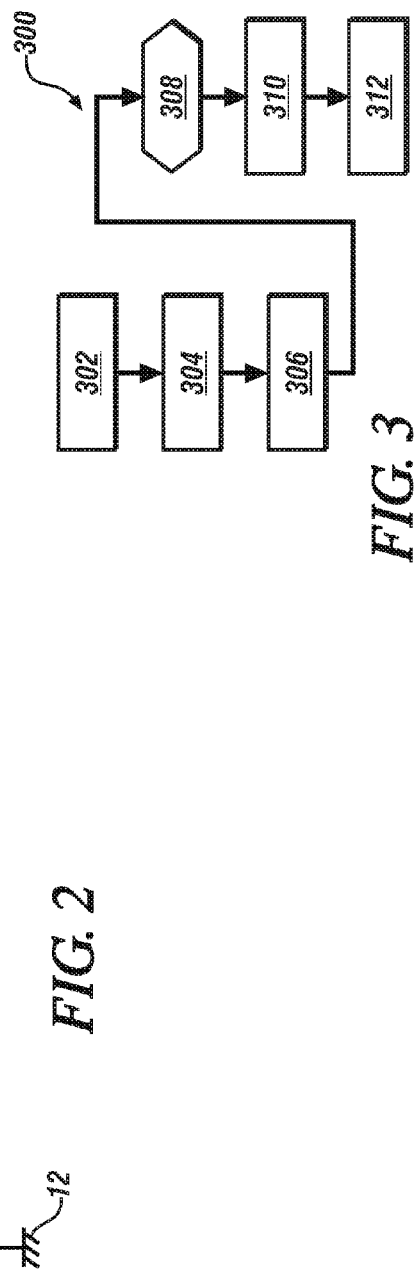
FIG. 2
FIG. 3

METHOD AND APPARATUS FOR MONITORING AN ELECTRIC POWER CIRCUIT

TECHNICAL FIELD

This disclosure is related to electric isolation of AC power circuits.

BACKGROUND

The statements in this section merely provide background information related to the present disclosure. Accordingly, such statements are not intended to constitute an admission of prior art.

Multi-phase, multi-pole electric motors can be employed on hybrid and electric vehicles to provide torque for propulsion and to meet other mechanical power needs. Such electric motors conduct some form of alternating current electric energy through wound electric cable to induce a magnetic field that acts upon a rotor and causes rotation thereof. The wound electric cable is assembled from insulated wire. Degradation in the insulation wire can reduce torque capacity of the electric motor, and measurement of wire insulation resistance can be employed to evaluate the condition of electrical insulation.

SUMMARY

A method for monitoring an electric power circuit configured to transfer a power signal to a torque module that is electrically isolated from a chassis ground includes injecting a common voltage component into a common mode voltage of electrical phases during operation and monitoring a negative-ground voltage and a positive-negative voltage of the electric power circuit. An AC line resistance is determined based upon the negative-ground voltage and the positive-negative voltage. Faults in electrical isolation between the electric power circuit and a chassis ground are detected based upon the AC line resistance.

BRIEF DESCRIPTION OF THE DRAWINGS

One or more embodiments will now be described, by way of example, with reference to the accompanying drawings, in which:

FIG. 2 illustrates portions of the electric power circuit of FIG. 1, in accordance with the disclosure;

FIG. 3 illustrates an isolation fault detection process for monitoring and detecting presence of a fault associated with isolation resistance between an electric power circuit and a chassis ground, in accordance with the disclosure.

DETAILED DESCRIPTION

Figure 1:
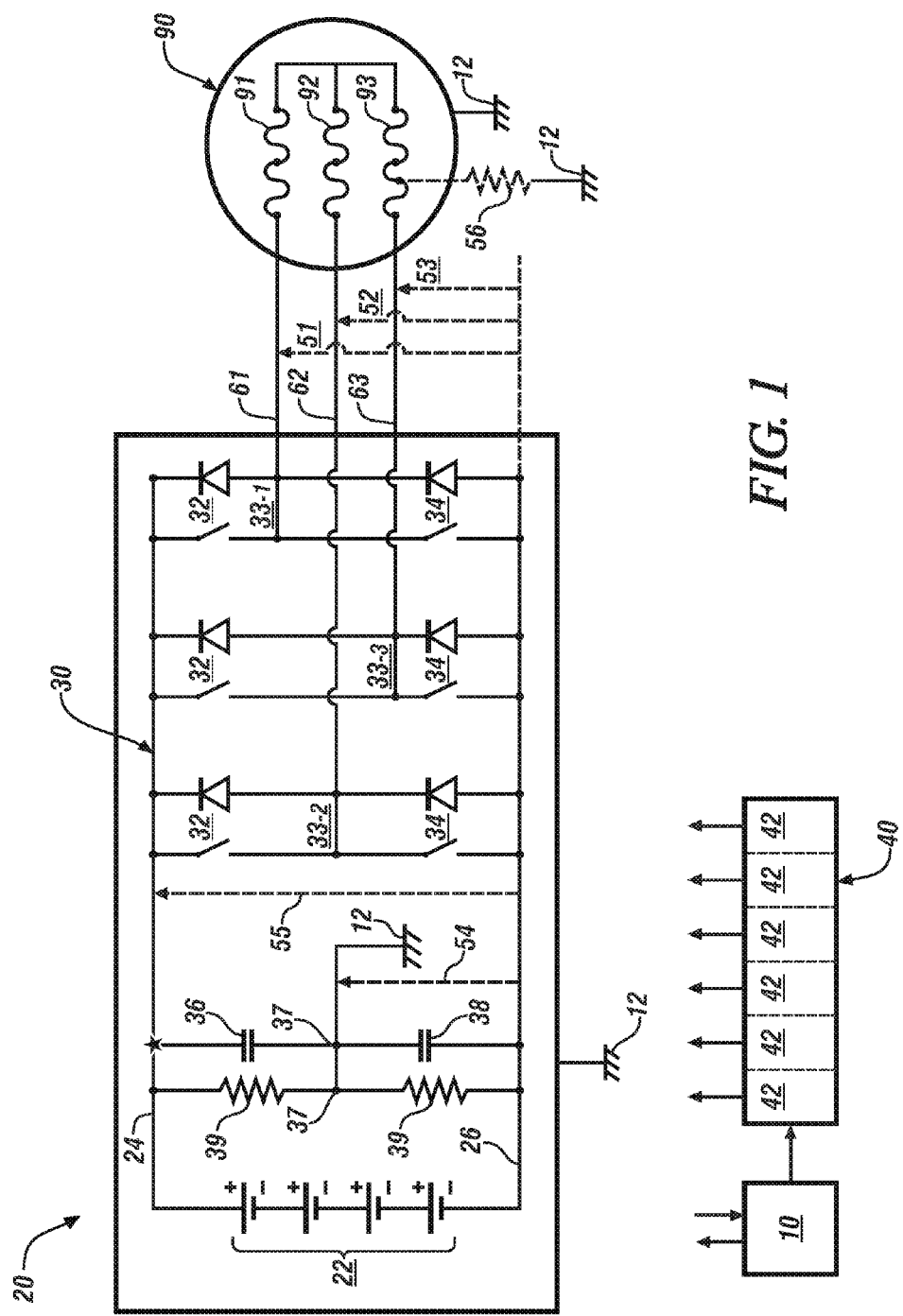
FIG. 1 illustrates an electric power circuit and controller for controlling operation of a multiphase torque module, in accordance with the disclosure.

Referring now to the drawings, wherein the showings are for the purpose of illustrating certain exemplary embodiments only and not for the purpose of limiting the same, FIG. 1 schematically shows an electric power circuit 20 and controller 10 for controlling operation of an electric module, which includes a multiphase electric motor/generator unit (torque module) 90 in one embodiment. The electric power circuit 20 has high-impedance isolation from a chassis ground 12 associated with a mechanical system in which the electric power circuit 20 and torque module 90 are mounted. The electric power circuit 20 includes a high-voltage DC electric power source (battery) 22, a multi-phase power inverter module 30 and a gate drive module 40 that are signally and operatively connected to controller 10. The battery 22 electrically connects to positive and negative sides of a high-voltage DC power bus (power bus) 24 and 26, respectively, which electrically connects to the inverter module 30.

The torque module 90 is a multi-phase, multi-pole electric machine including a rotor and stator that can operate to either transform electric power to mechanical torque or operate to transform mechanical torque to electric power. The torque module 90 is a three-phase device in one embodiment and as shown, and includes electrical components that form a first phase 91, a second phase 92, and a third phase 93. Other multi-phase configurations may be employed without limitation. Electrical power elements of the torque module 90 are electrically isolated from the chassis ground 12. Some mechanical elements of the torque module 90 electrically connect to the chassis ground 12.

The inverter 30 includes a plurality of complementary paired switch devices 32, 34 electrically connected in series between the positive and negative sides of the power bus 24, 26 with each of the paired switch devices 32, 34 associated with one of the phases of the torque module 90. Each of the paired switch devices 32, 34 is a suitable high-voltage switch, e.g., a semi-conductor device having low-on impedance that is preferably an order of magnitude of milli-ohms. In one embodiment, the paired switch devices 32, 34 are insulated gate bipolar transistors (IGBT). In one embodiment, the paired switch devices 32, 34 are field-effect transistor (FET) devices. In one embodiment, the FET devices may be MOSFET devices. The paired switch devices 32, 34 are configured as pairs to control electric power flow between the positive side of the power bus 24 and one of the electric cables connected to and associated with one of the phases of torque module 90 and the negative side of the power bus 26.

The inverter 30 also includes a pair of high-voltage DC link capacitors (capacitors) 36, 38 that electrically connect in series between the positive and negative sides of the power bus 24, 26. The junction 37 between the capacitors 36, 38 electrically connects to the chassis ground 12. The capacitors 36, 38 preferably have the same capacitance, which is a capacitance of 3000 µF in one embodiment. The capacitors 36, 38 are suitable to maintain electrical potential across the positive and negative sides of the power bus 24, 26, but may lack capacity to fully substitute for the battery 22. Resistors 39 electrically connect in parallel with the capacitors 36, 38, including electrically connecting between the positive and negative sides of the power bus 24, 26 and at the junction 37. The inverter 30 may also include other circuit elements, including by way of example, an active DC bus discharge circuit including a resistor and a switch that electrically connects in series between the positive and negative sides of the power bus 24, 26.

The gate drive module 40 includes a plurality of paired gate drive circuits 42, each which signally individually connects to one of the paired switch devices 32, 34 of one of the phases to control operation thereof. Thus there are three paired gate drive circuits 42 or a total of six gate drive circuits 42 when the torque module 90 is a three-phase device. The gate drive module 40 receives operating commands from the controller 10 and controls activation and deactivation of each of the switch devices 32, 34 via the gate drive circuits 42 to provide motor drive or electric power generation functionality that is responsive to the operating commands. During operation, each gate drive circuit 42 generates a pulse in response to a control signal originating from the control module 10, which activates one of the switch devices 32, 34 and permits current flow through a half-phase of the torque module 90.

A series junction 33 of each of the paired switch devices 32, 34 electrically connects to the corresponding phase of the torque module 90 to transfer electric power. As shown, AC output line 61 electrically connects first series junction 33-1 to the first phase 91 of the torque module 90, AC output line 62 electrically connects a second series junction 33-2 to the second phase 92 of the torque module 90, and AC output line 63 electrically connects third series junction 33-3 to the third phase 93 of the torque module 90 to transfer electric power.

The controller 10 provides operating commands for the paired gate drive circuits 42 of the gate drive module 40, and monitors operation of the electric power circuit 20 and torque module 90, including monitoring a negative-ground voltage $V_{GN}$ 54 and a positive-negative voltage $V_{PN}$ 55. The operating commands for the paired gate drive circuits 42 of the gate drive module 40 control the electric power circuit 20, which generates power signals that are conveyed to the first, second, and third phases of the torque module 90. The power signals can be in the form any one of a sine PWM (pulsewidth-modulation) signal, a space vector PWM signal, a third harmonics insertion PWM signal and discontinuous PWM signals, e.g., DPWM1, DPWM2, and DPWM3.

Electrical potentials of interest include phase A voltage ($V_{AN}$) 51, which is the electrical potential between the first series junction 33-1 electrically connected to the first phase 91 of the torque module 90 and the negative power bus 26, phase B voltage ($V_{BN}$) 52, which is the electrical potential between the second series junction 33-2 electrically connected to the second phase 92 of the torque module 90 and the negative power bus 26, and phase C voltage ($V_{CN}$) 53, which is the electrical potential between the third series junction 33-3 electrically connected to the third phase 93 of the torque module 90 and the negative power bus 26, the negative-ground voltage $V_{GN}$ 54, which is the electrical potential between the junction 37 between the capacitors 36, 38 electrically connected to the chassis ground 12 and the negative power bus 26, and the positive-negative voltage $V_{PN}$ 55, which is the electrical potential between the positive power bus 24 and the negative power bus 26. A pseudo-resistance $R_{AC\text{-}line}$ 56 is shown for purposes of illustration, and represents an electric resistance or isolation between the electric power circuit 20 and the chassis ground 12, but does not represent an actual device. The pseudo-resistance $R_{AC\text{-}line}$ 56 indicates electrical isolation between the electric power circuit 20 and the chassis ground 12. An equivalent isolation resistance $R_{sys}$ indicates an equivalent isolation resistance of the electrical system, and incorporates resistances associated with the battery 22, inverter 22, gate drive module 40 and other electrical components and systems taken in parallel.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 100 microseconds, 3.125, 6.25, 12.5, 25 and 100 milliseconds during ongoing operation. Alternatively, routines may be executed in response to occurrence of an event.

FIG. 2 schematically shows portions of the electric power circuit 20 to provide support for an analytical framework for determining a magnitude of electrical isolation between the electric power circuit 20 and the chassis ground 12, indicated herein by the pseudo-resistance $R_{AC\text{-}line}$ 56. The illustrated portion of the electric power circuit 20 includes battery 22, positive and negative sides of power bus 24 and 26, capacitors 36, 38, junction 37 between the capacitors 36, 38 electrically connected to chassis ground 12 and the resistors 39. Impedances include Phase A impedance $Z_A$ 71, Phase B impedance $Z_B$ 72, and Phase C impedances $Z_{C1}$ 73 and $Z_{C2}$ 74. Voltage $V_{FN}$ 57 indicates the electrical potential occurring between phase C impedances $Z_{C1}$ 73 and $Z_{C2}$ 74, and can be used to determine the pseudo-resistance $R_{AC\text{-}line}$ 56 and thus indicate the electrical isolation between the electric power circuit 20 and the chassis ground 12. The phase C impedances $Z_{C1}$ 73 and $Z_{C2}$ 74 are shown to depict analysis of the isolation of phase C of the electric power circuit 20. It is appreciated that an analogous analysis as described herein is performed on each of the phases A, B, and C. Under ideal operating conditions with no degradation in the isolation of the circuit, Phase C impedance $Z_{C1}$ 73 is equal to zero and the voltage $V_{FN}$ 57 is equal to phase C voltage ($V_{CN}$) 53.

A process for monitoring an electric power circuit configured to transfer a power signal to a torque module that is electrically isolated from a chassis ground to determine a magnitude of AC electrical isolation during operation with the system under stress of power signals includes injecting a common voltage component into the common mode voltage of each of the electric phases of the electric power circuit during operation during a period of time when the AC lines are energized with the PWM voltage from the inverter. Monitoring includes monitoring a negative-ground voltage and a positive-negative voltage of the electric power circuit. An AC line resistance is determined based upon the negative-ground voltage and the positive-negative voltage. A fault can be detected in electrical isolation between the electric power circuit and a chassis ground based upon the AC line resistance.

The process of injecting a common voltage component into the common mode voltages of all the phases during a period of time when the AC lines are energized with the PWM voltage from the inverter includes injecting a voltage component that is between a half and a third of the potential across the high-voltage DC power bus at a low operating speed for a period of time that is sufficient to exclude momentary faults, preferably between three and five seconds. Preferably the load, i.e., the torque module 90 sees or is exposed to line-to-line voltages (i.e. Vab=Va−Vb, Vbc=Vb−Vc, Vca=Vc−Va) to produce the current. Phase voltages without the injected common voltage component have the same effect upon the torque module 90 as phase voltages with the injected common voltage component. Thus, by way of example, a first set of phase voltages of Va=10, Vb=50, Vc=−60 have the same effect as a second set of phase voltages of Va=10+37, Vb=50+37, Vc=−60+37, with each of the second set of phase voltages having 37 volts of common mode voltage. In one embodiment, the common voltage component injected into each of the common mode voltages of all the phases is a DC voltage component. Alternatively, the common voltage component injected into each of the common mode voltages of all the phases is a waveform, e.g., a 60 Hz triangle wave, with a detection scheme seeking to identify the waveform to determine if loss of isolation has occurred. Alternatively, the common voltage component injected into each of the common mode voltages of all the phases is a plurality of DC voltages. Other common voltage components may be employed without limitation.

As described herein, monitored electrical potentials include only negative-ground voltage $V_{GN}$ 54 and positive-negative voltage $V_{PN}$ 55, which are measured for other purposes related to system control. An insulation resistance between the AC output lines of the inverter and the torque module, i.e., lines 61, 62 and 63 and chassis 12 can be determined, thus permitting detection of AC loss of isolation at any point on the AC lines including the neutral line. The described process overcomes any electro-endosmosis effect by employing a charge-negative injected common voltage component. Electro-endosmosis is a phenomenon wherein different insulation resistance values may be obtained when the polarity of the tester leads are reversed due to the presence of moisture, e.g., due to intrusion of rainwater into the system.

Line-to-line electrical potentials, i.e., $V_{AB}$, $V_{BC}$, and $V_{AC}$ remain unchanged after injecting a common voltage component in the common mode voltage of each of the three phases during a normal operation, since the inverter 30 is high-impedance isolated from the chassis 12. This can be demonstrated in accordance with the following set of relationships:

$$V_{A'N} = V_{AN} + V^{dc}_{CMode}$$

$$V_{B'N} = V_{BN} + V^{dc}_{CMode}$$

$$V_{C'N} = V_{CN} + V^{dc}_{CMode} \quad [1]$$

wherein
  $V_{AN}$ is the electrical potential between the first phase 91 of the torque module 90 and the negative power bus 24,
  $V_{BN}$ is the electrical potential between the second phase 92 of the torque module 90 and the negative power bus 24,
  $V_{AN}$ is the electrical potential between the third phase 93 of the torque module 90 and the negative power bus 24,
  $V^{dc}_{CMode}$ is the injected common voltage component in the common mode voltage,
  $V_{A'N}$ is the electrical potential between the first phase 91 of the torque module 90 and the negative power bus 24 with addition of the injected common voltage component in the common mode voltage,
  $V_{B'N}$ is the electrical potential between the second phase 92 of the torque module 90 and the negative power bus 24 with addition of the injected common voltage component in the common mode voltage, and
  $V_{C'N}$ is the electrical potential between the third phase 93 of the torque module 90 and the negative power bus 24 with addition of the injected common voltage component in the common mode voltage.

The line-to-line electrical potentials can be calculated in relation to other common electrical potentials, e.g., the negative power bus 24 in accordance with the following set of relationships.

$$V_{AB} = V_{AN} - V_{BN}$$

$$V_{AC} = V_{AN} - V_{CN}$$

$$V_{BC} = V_{BN} - V_{CN} \quad [2]$$

As is clear, when $V^{dc}_{CMode}$, i.e., the injected common voltage component in the common mode voltage is the same for each of the lines the following set of relationships are true.

$$V_{AN} - V_{BN} = V_{A'N} - V_{B'N}$$

$$V_{AN} - V_{CN} = V_{A'N} - V_{C'N}$$

$$V_{BN} - V_{CN} = V_{B'N} - V_{C'N} \quad [3]$$

Therefore, from the preceding sets of relationships, the following set of relationships are derived.

$$V_{AB} = V_{AN} - V_{BN} = V_{A'N} - V_{B'N} = V_{A'B},$$

$$V_{AC} = V_{AN} - V_{CN} = V_{A'N} - V_{C'N} = V_{A'C}, \text{ and}$$

$$V_{BC} = V_{BN} - V_{CN} = V_{B'N} - V_{C'N} = V_{B'C}. \quad [4]$$

Thus, injecting the common voltage component in the common mode voltage of the three phases $V^{dc}_{CMode}$ does not affect the normal operation.

When AC line isolation degrades, injecting the common voltage component in the common mode voltage $V^{dc}_{CMode}$ causes the negative-ground voltage $V_{GN}$ 54 to shift toward the voltage on the negative power bus 26 (HV−) through $R_{AC\text{-}line}$ 56 when the common mode voltage $V^{dc}_{CMode}$ is chosen to be negative. This voltage shifting behavior can be employed to measure pseudo-resistance $R_{AC\text{-}line}$ 56 in accordance with the following set of relationships:

$$(V_{FN} - V_{GN})/R_{AC\text{-}line} + (V_{PN} - V_{GN})/R_{sys} = V_{GN}/R_{sys} \quad [5]$$

wherein
  $V_{FN}$ indicates the electrical potential occurring between phase C impedances $Z_{C1}$ 73 and $Z_{C2}$ 74,
  $V_{GN}$ indicates the negative-ground voltage, and
  $V_{PN}$ indicates the positive-negative voltage.

The process is described and detailed for determining the electrical potential occurring between phase C impedances $Z_{C1}$ 73 and $Z_{C2}$ 74. It is appreciated that an analogous process is employed to monitor and evaluate each of the phases, e.g., phases A and B in this embodiment.

Thus the electrical potential occurring between phase C impedances $Z_{C1}$ 73 and $Z_{C2}$ 74 can be determined, in accordance with the following relationship.

$$V_{FN} = \frac{(Z_B + Z_{C2}) * Z_{C1} * Z_{A'N} + Z_{C1} * (Z_A + Z_{C2}) * V_{B'N} + (Z_A + Z_{C2}) * (Z_B + Z_{C2}) * V_{C'N}}{(Z_A + Z_{C2}) * (Z_B + Z_{C2}) + (Z_B + Z_{C2}) * Z_{C1} + Z_{C1}(Z_A + Z_{C2})} \quad [6]$$

wherein the Z terms are depicted and described herein with reference to FIG. 2.

A known system operating in response to the power signal without presence of a system fault yields results in accordance with the following relationship.

$$V^{dc}_{AN} = V^{dc}_{BN} = V^{dc}_{CN} = V_{PN}/2 \quad [7]$$

When a common voltage component in the common mode voltage $V^{dc}_{CMode}$ is injected into the power signal, electrical potentials result in accordance with the following relationship:

$$V^{dc}_{A'N} = V^{dc}_{B'N} = V^{dc}_{C'N} = V_{PN}/2 + V^{dc}_{CMode} \quad [8]$$

Therefore, combining EQ. 6 and EQ. 8, results in the following relationship.

$$V^{dc}_{FN} = V_{PN}/2 + V^{dc}_{CMode} \quad [9]$$

From EQ. 5 and EQ. 9, the isolation resistance of AC lines $R_{AC-line}$ can be obtained when only electrical potentials of $V_{PN}$ and $V_{GN}$ are monitored in accordance with the following relationship.

$$R_{AC-line} = (V_{GN} - V_{PN}/2 - V^{dc}_{CMode}) * R_{sys}/(V_{PN} - 2*V_{GN}) \qquad [10]$$

The result of this analysis indicates that, for an inverter electric system with high-impedance isolation from a chassis, isolation resistance between the AC lines and the chassis can be measured in real-time by injecting a common voltage component in the common mode voltage of all three phases, while the AC lines are energized with the PWM voltage. Furthermore, the injected common voltage component is not limited to a DC component to effect measurement of the AC isolation resistance. It can include multiple DC voltage levels or a repeated waveform as an input. The associated signals of high-voltage voltage sensing can be employed to characterize the AC isolation resistance. However, a DC voltage component is preferred since it is the simplest to implement.

FIG. 3 schematically shows an isolation fault detection process 300 for monitoring and detecting presence of a fault associated with isolation resistance between an electric power circuit and a chassis ground, e.g., the electric power circuit 20 including the inverter 30 and torque module 90 of FIG. 1. The isolation fault detection process 300 operates to monitor insulation resistance between AC lines and chassis while the AC lines are PWM-energized. Table 1 is provided as a key to FIG. 3 wherein the numerically labeled blocks and the corresponding functions are set forth as follows.

TABLE 1

| BLOCK | BLOCK CONTENTS |
|---|---|
| 302 | Inject common voltage component in the common mode voltage $V^{dc}_{CMode}$ |
| 304 | Monitor $V_{GN}$ and $V_{PN}$ |
| 306 | Calculate $R_{AC-line}$ based upon $V_{PN}$ and $V_{GN}$ |
| 308 | Compare $R_{AC-line}$ with threshold |
| 310 | Identify fault when $R_{AC-line}$ is greater than threshold |
| 312 | Remediate |

The isolation fault detection process 300 operates by injecting a common voltage component in the common mode voltage $V^{dc}_{CMode}$ of a power signal while the AC lines are energized with the power signal from the inverter (302). Preferably, the injected common voltage component in the common mode voltage $V^{dc}_{CMode}$ is charge-negative to overcome any risk of an electro-endosmosis effect. Electrical potentials including $V_{GN}$ and $V_{PN}$ are monitored (304). The term $V_{GN}$ indicates the negative-ground voltage and the term $V_{PN}$ indicates the positive-negative voltage, as previously described. The isolation resistance $R_{AC-line}$ is determined using the monitored values of $V_{PN}$ and $V_{GN}$, preferably as described with reference to EQ. 10 (306). The isolation resistance $R_{AC-line}$ is compared to a threshold resistance (308), and when the threshold resistance is exceeded, a fault associated with the isolation resistance $R_{AC-line}$ of the selected system is detected (310). Upon detecting a fault, the system executes remediation, which can include derating the motor capacity (312).

Figure 4:
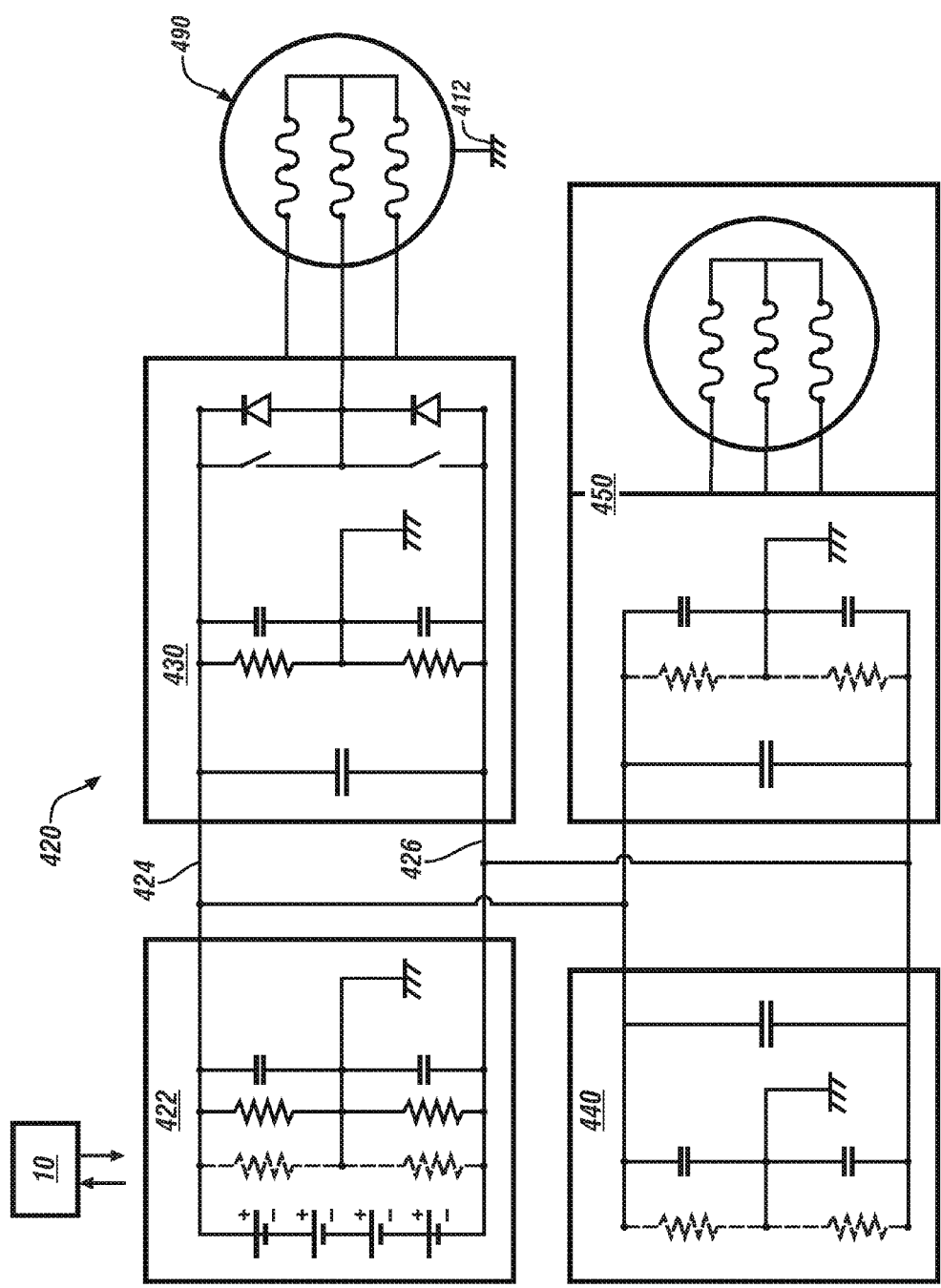
FIG. 4 illustrates a multi-function electric power circuit including a battery that electrically connects to positive and negative sides of a high-voltage DC power bus that electrically connects to a plurality of torque modules, in accordance with the disclosure.

FIG. 4 schematically shows a multi-function electric power circuit 420 including a battery 422 that electrically connects to positive and negative sides of a high-voltage DC power bus (power bus) 424 and 426, respectively, which electrically connect in parallel to a plurality of modules. The modules include a multi-phase power inverter module 430 that electrically connects to an electric torque module 490, an electric pump power module 440, and an inverter module and an electric AC compressor torque module 450. A control module 410 is configured to monitor and control operation of each of the aforementioned elements. Each of the aforementioned elements is high-impedance isolated from a chassis ground 12 associated with a mechanical system in which they are mounted. In operation, the system can identify which set of AC lines has low isolation resistance by individually injecting a common voltage component in the common mode voltage $V^{dc}_{CMode}$ of the power signals and executing the isolation fault detection process 300 one-by-one for each of the aforementioned modules.

Thus a system and method are provided that measure the insulation resistance between AC lines and chassis while the AC lines are energized with the PWM voltage from the inverter based upon measurements of electrical potentials. The process includes measuring the insulation resistance in real-time and identifying which set of AC lines has low isolation resistance (if any), and overcoming the electroendosmosis effect, without additional hardware such as a microammeter to measure current resistance. Instead, the insulation resistance of inverter AC outputs based on only voltage readings. This AC isolation resistance can classify the severity of the AC-to-chassis fault and determine the necessary response.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for monitoring an electric power circuit configured to transfer a power signal to a torque module, said electric power circuit electrically isolated from a chassis ground, the method comprising:
   injecting a common voltage component into a common mode voltage of electrical phases of the electric power circuit during operation while the electrical phases are electrically energized with an AC PWM voltage and monitoring a negative-ground voltage and a positive-negative voltage of the electric power circuit;
   determining an AC line resistance indicating an electric resistance between the electric power circuit and the chassis ground, based upon a relationship between the negative-ground voltage, the positive-negative voltage, the injected common voltage component, and an equivalent isolation resistance of the electric power circuit; and
   detecting a fault in electrical isolation between the electric power circuit and a chassis ground based upon the AC line resistance.

2. The method of claim 1, wherein determining an AC line resistance comprises determining a resistance between a neutral line of the electric power circuit and the chassis ground.

3. The method of claim 1, wherein the electric power circuit for the module comprises an inverter electrically connected to a multi-phase electric torque module.

4. The method of claim 1, wherein the negative-ground voltage is the electrical potential between a junction between capacitors electrically connected to the chassis ground and the negative power bus.

5. The method of claim 1, wherein the positive-negative voltage is the electrical potential between a positive power bus and a negative power bus.

6. The method of claim 1, wherein the electric power circuit comprises a battery and a multi-phase inverter electrically coupled to a multi-phase torque module.

7. The method of claim 1 wherein injecting the common voltage component into the common mode voltage of electrical phases during operation comprises injecting a charge-negative DC voltage into the common-mode voltage.

8. The method of claim 1, wherein injecting the common voltage component into the common mode voltage of electrical phases during operation comprises injecting a voltage component having a waveform into the common mode voltage.

9. The method of claim 8, wherein injecting the voltage component having a waveform into the common mode voltage comprises injecting a voltage component having a waveform that is charge-negative.

10. The method of claim 1, wherein the AC line resistance is determined in accordance with the following relationship:

$$R_{AC\text{-}line}=(V_{GN}-V_{PN}/2-V^{dc}_{CMode})*R_{sys}/(V_{PN}-2*V_{GN})$$

wherein
- $R_{AC\text{-}line}$ is the isolation resistance of the AC line,
- $V_{GN}$ is the negative-ground voltage,
- $V_{PN}$ is the positive-negative voltage,
- $V^{dc}_{CMode}$ is the common voltage component injected into the common mode voltage, and
- $R_{sys}$ is an equivalent isolation resistance of the electrical system.

11. A method for monitoring a multi-phase inverter, comprising:
- injecting a common voltage component into a common-mode voltage of electric phases of the inverter during operation while the electrical phases are electrically energized with an AC PWM voltage;
- monitoring a negative-ground voltage and a positive-negative voltage of the electric power circuit;
- calculating an electrical potential occurring between a phase impedance for each electric phase of the inverter;
- determining an AC line resistance indicating an electric resistance between the electric power circuit and the chassis ground, based upon a relationship between the electrical potential occurring between the phase impedances, the negative ground voltage, the positive-negative voltage, and the injected common voltage component; and
- evaluating electrical isolation of the inverter based upon the AC line resistance.

12. The method of claim 11, wherein evaluating electrical isolation of the inverter based upon the AC line resistance comprises detecting a fault in the electrical isolation of the multi-phase inverter from a chassis ground based upon the AC line resistance.

13. The method of claim 11, wherein determining the AC line resistance based upon a relationship between the electrical potential occurring between the phase impedances, the negative-ground voltage, the positive-negative voltage, and the injected common voltage component comprises determine the AC line resistance in accordance with the following relationship:

$$R_{AC\text{-}line}=(V_{GN}-V_{PN}/2-V^{dc}_{CMode})*R_{sys}/(V_{PN}-2*V_{GN})$$

wherein
- $R_{AC\text{-}line}$ is the isolation resistance of the AC line,
- $V_{GN}$ is the negative-ground voltage,
- $V_{PN}$ is the positive-negative voltage,
- $V^{dc}_{CMode}$ is the common voltage component injected into the common mode voltage, and
- $R_{sys}$ is an equivalent isolation resistance of the electrical system.

14. The method of claim 11, wherein injecting the common voltage component into the common mode voltage of electrical phases during operation-comprises injecting a charge-negative DC voltage into the common-mode voltage.

15. The method of claim 11, wherein injecting the common voltage component into the common mode voltage of electrical phases during operation-comprises injecting a voltage component having a waveform into the common mode voltage.

16. The method of claim 15, wherein injecting the voltage component having a waveform into the common mode voltage comprises injecting a voltage component having a waveform that is charge-negative.

* * * * *